(12) United States Patent
Song (10) Patent No.: US 12,206,966 B2
(45) Date of Patent: *Jan. 21, 2025

(54) SENSOR DRIVING DEVICE HAVING SUBSTRATE WITH ELECTROMAGNETIC DRIVING UNIT AND PROTRUSION PART AND CAMERA MODULE HAVING SAME

(71) Applicant: LG INNOTEK CO., LTD., Seoul (KR)

(72) Inventor: Yun Sang Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/224,836

(22) Filed: Jul. 21, 2023

(65) Prior Publication Data

US 2023/0362467 A1    Nov. 9, 2023

Related U.S. Application Data

(63) Continuation of application No. 18/074,883, filed on Dec. 5, 2022, now Pat. No. 11,800,210, which is a continuation of application No. 17/266,360, filed as application No. PCT/KR2019/010945 on Aug. 27, 2019, now Pat. No. 11,539,867.

(30) Foreign Application Priority Data

Aug. 27, 2018 (KR) .................... 10-2018-0100430

(51) Int. Cl.
*H04N 23/54* (2023.01)
*G02B 3/12* (2006.01)
(Continued)

(52) U.S. Cl.
CPC .............. *H04N 23/54* (2023.01); *G02B 3/12* (2013.01); *H01F 7/081* (2013.01); *H01F 7/126* (2013.01);
(Continued)

(58) Field of Classification Search
CPC ........ H04N 23/54; H04N 23/55; H04N 23/57; H04N 23/51; H04N 23/687; H04N 23/68;
(Continued)

(56) References Cited

U.S. PATENT DOCUMENTS 8,248,497 B2    8/2012   Tanimura et al.
10,033,917 B1 *  7/2018   Silverstein ............... G02B 7/04
(Continued)

FOREIGN PATENT DOCUMENTS

JP    2006-115452 A    4/2006
JP    2007-58090 A     3/2007
(Continued)

*Primary Examiner* — Twyler L Haskins
*Assistant Examiner* — Akshay Trehan
(74) *Attorney, Agent, or Firm* — Birch, Stewart, Kolasch & Birch, LLP (57) ABSTRACT

A sensor driving device includes a first substrate; a second substrate disposed on the first substrate; and an image sensor. The second substrate includes a body having first and second lateral surfaces; a first protrusion part protruding from the first lateral surface; and a second protrusion part protruding from the second lateral surface. The first protrusion part includes a first extension part, and a second extension part extending in a direction different from the first extension part. The second protrusion part includes a first extension part, and a second extension part extending in a direction different from the first extension part. The first extension parts are disposed parallel to an optical axis of the image sensor. The second extension part of the first protrusion part is closer to the second extension part of the second protrusion part than to the first extension part of the second protrusion part.

20 Claims, 9 Drawing Sheets

(51) Int. Cl.

| | | |
|---|---|---|
| *G02B 26/00* | (2006.01) | |
| *H01F 7/08* | (2006.01) | |
| *H01F 7/126* | (2006.01) | |
| *H04N 23/51* | (2023.01) | |
| *H04N 23/55* | (2023.01) | |
| *H04N 23/57* | (2023.01) | |
| *H04N 23/68* | (2023.01) | |
| *H05K 1/14* | (2006.01) | |
| *H05K 1/18* | (2006.01) | |

(52) U.S. Cl.
CPC .............. *H04N 23/55* (2023.01); *H04N 23/57* (2023.01); *H04N 23/68* (2023.01); *H04N 23/687* (2023.01); *H05K 1/147* (2013.01); *H05K 1/181* (2013.01); *G02B 26/004* (2013.01); *H04N 23/51* (2023.01); *H05K 2201/041* (2013.01); *H05K 2201/09063* (2013.01); *H05K 2201/09072* (2013.01); *H05K 2201/10151* (2013.01)

(58) Field of Classification Search
CPC ......... G02B 26/004; G02B 3/12; H01F 7/081; H01F 7/126; H05K 1/147; H05K 1/181; H05K 2201/041; H05K 2201/09063; H05K 2201/09072; H05K 2201/10151
See application file for complete search history.

(56) References Cited

U.S. PATENT DOCUMENTS

| | | |
|---|---|---|
| 2003/0076421 A1 | 4/2003 | Dutta |
| 2006/0017815 A1 | 1/2006 | Stavely et al. |
| 2006/0082658 A1* | 4/2006 | Lee ................ H04N 23/687 348/208.7 |
| 2007/0279497 A1 | 12/2007 | Wada et al. |
| 2008/0198249 A1* | 8/2008 | Tanimura ............ H04N 23/68 348/294 |
| 2009/0126976 A1 | 5/2009 | Ida |
| 2013/0087877 A1* | 4/2013 | Sakaguchi ........ H01L 27/14603 257/443 |
| 2014/0071304 A1 | 3/2014 | Kim |
| 2014/0184891 A1 | 7/2014 | Lee et al. |
| 2016/0037031 A1 | 2/2016 | Bull et al. |
| 2017/0343767 A1 | 11/2017 | Eromäki |
| 2017/0351159 A1 | 12/2017 | Kudo |
| 2018/0041668 A1 | 2/2018 | Cui |
| 2018/0171991 A1* | 6/2018 | Miller ................ F16M 11/125 |
| 2018/0173080 A1 | 6/2018 | Enta |
| 2018/0203203 A1* | 7/2018 | Lee ................ H04N 23/687 |
| 2019/0014258 A1* | 1/2019 | Horesh ................ H04N 23/71 |
| 2019/0020822 A1* | 1/2019 | Sharma ................ G03B 3/10 |
| 2019/0136839 A1 | 5/2019 | Miller et al. |

FOREIGN PATENT DOCUMENTS

| | | |
|---|---|---|
| JP | 2008-203402 A | 9/2008 |
| JP | 2009-10259 A | 1/2009 |
| JP | 2012-85175 A | 4/2012 |
| JP | 2016-36137 A | 3/2016 |
| JP | 2017-517928 A | 6/2017 |
| JP | 2017-199989 A | 11/2017 |
| KR | 10-2006-0034356 A | 4/2006 |
| KR | 10-0770680 B1 | 10/2007 |
| KR | 10-2011-0108148 A | 9/2011 |
| KR | 10-2012-0122466 A | 11/2012 |
| KR | 10-2014-0086622 A | 7/2014 |

\* cited by examiner

SENSOR DRIVING DEVICE HAVING SUBSTRATE WITH ELECTROMAGNETIC DRIVING UNIT AND PROTRUSION PART AND CAMERA MODULE HAVING SAME

CROSS REFERENCE TO RELATED APPLICATIONS

This application is a Continuation of U.S. application Ser. No. 18/074,883, filed on Dec. 5, 2022, which is a Continuation of U.S. application Ser. No. 17/266,360, filed on Feb. 5, 2021 (now U.S. Pat. No. 11,539,867, issued on Dec. 27, 2022), which is the National Phase of PCT International Application No. PCT/KR2019/010945, filed on Aug. 27, 2019, which claims priority under 35 U.S.C. 119(a) to Patent Application No. 10-2018-0100430, filed in the Republic of Korea on Aug. 27, 2018, all of which are hereby expressly incorporated by reference into the present application.

TECHNICAL FIELD

The present invention relates to a sensor driving device and a camera module.

BACKGROUND ART

The content described below provides background information for the present embodiment, but does not describe the prior art.

As the spread of various mobile terminals is widely generalized and wireless Internet services are commercialized, the demands of consumers related to the mobile terminals are also diversified, and various types of additional devices are mounted on the mobile terminals.

Among them, there is a camera module for photographing a subject as a photograph or a moving picture. Meanwhile, in recent camera modules, an autofocus function that automatically adjusts focus according to the distance of a subject is applied. In addition, an image stabilization function that prevents an image from shaking caused by the hand shaking of a photographer has been applied.

Meanwhile, various attempts have been made to reduce the size of a sensor driving device applied to a camera module and reduce power consumption for an auto focus function or an image stabilization function.

SUMMARY OF THE INVENTION

Technical Subject

The problem to be solved by the present invention is to provide a sensor driving device and a camera module capable of reducing the size of the sensor driving device and reducing power consumption.

Technical Solution

A sensor driving device according to one aspect of the present invention for achieving the above objective comprises: a first substrate; a second substrate disposed on the first substrate and electrically connected to the first substrate; and an image sensor disposed on the second substrate, wherein the second substrate comprises: a body and a first protrusion part protruding from one end of the body, and wherein the first protrusion part comprises: a first extension part extending from the body in a first direction; and a second extension part extending from the first extension part in a second direction that differs from the first direction.

In addition, the second substrate comprises a second protrusion part protruding from the one end of the body and spaced apart from the first protrusion part, wherein the second protrusion part may comprise a first extension part extending from the body in the first direction and a second extension part extending from the first extension part in the second direction.

In addition, the second substrate comprises: a third protrusion part protruding from the other end of the body; and a fourth protrusion part spaced apart from the third protrusion part, wherein the third protrusion part comprises: a first extension part extending from the body in a third direction; and a second extension part extending from the first extension part in a fourth direction different from the first direction, and wherein the fourth protrusion part may comprise: a first extension part extending from the body in the third direction; and a second extension part extending from the first extension part in the fourth direction.

In addition, one end and the other end of the body are outer circumferential surfaces of the body, and the first direction and the third direction are the optical axis direction, the second direction, and the fourth direction may be a direction passing through the area overlapped with the body in the optical axis direction.

In addition, a second extension part of the first protrusion part, a second extension part of the second protrusion part, a second extension part of the third protrusion part, and a second extension part of the fourth protrusion part may be overlapped with the body in the optical axis direction.

In addition, the second substrate may comprise a first pad part having one end connected to the first protrusion part and the other end disposed on the first substrate.

In addition, the first pad part may comprise: a first pad unit formed by being bent from the second extension part of the first protrusion part; a second pad unit formed by being bent from the first pad unit; and a third pad unit formed by being bent from the second pad unit.

In addition, the second substrate may comprise: a first pad part having one end connected to the first protrusion part and the other end disposed on the first substrate; a second pad part having one end connected to the second protrusion part and the other end disposed on the first substrate; a third pad part having one end connected to the third protrusion part and the other end disposed on the first substrate; and a fourth pad part having one end connected to the fourth protrusion part and the other end disposed on the first substrate.

In addition, the first to fourth pad parts may be spaced apart from each other and may not be overlapped with the body in the optical axis direction.

In addition, a first driving unit disposed on the second substrate and a second driving unit corresponding to the first driving unit may be further comprised.

In addition, the first driving unit may comprise a plurality of first driving units disposed on the body of the second substrate.

In addition, the plurality of first driving units may comprise four first driving units disposed adjacent to a corner region of the image sensor and two first driving units disposed adjacent to a central region of a side of the image sensor.

In addition, the second driving unit may comprise a plurality of second driving units disposed at positions corresponding to the plurality of first driving units of the first driving unit.

In addition, it may comprise a holder disposed between the first driving unit and the second driving unit, and a plurality of wires coupled to the second substrate and the holder.

In addition, the first substrate may comprise an opening in which the body of the second substrate is disposed, and a connector disposed adjacent to the opening and coupled to the first pad part of the second substrate In addition, the first driving unit further comprises a third substrate on which the plurality of first driving units are disposed, the second driving unit further comprises a fourth substrate on which the plurality of second driving units are disposed, and the third substrate and the fourth substrate may comprise openings overlapped with the image sensor in the optical axis direction A sensor driving device according to an aspect of the present invention for achieving the above objective comprises: a first substrate; a second substrate disposed on the first substrate and electrically connected to the first substrate; an image sensor disposed on the second substrate; a first driver disposed on the second substrate; and a second driving unit disposed to correspond to the first driving unit, wherein the first driving unit comprises a plurality of first driving units disposed adjacent to the circumference of the image sensor, and a portion of the second substrate is overlapped with the plurality of first driving units in a direction perpendicular to an optical axis.

In addition, the plurality of first drive units may comprise: two first driving units disposed adjacent to both ends of the first side of the image sensor; two first driving units disposed adjacent to both ends of a second side facing the first side of the image sensor; and two first driving units disposed adjacent to the center regions of the third and fourth sides of the image sensor.

In addition, in the sensor driving device, the second substrate comprises a plurality of protrusion parts, and the plurality of protrusion parts comprises: a first extension part extending in the optical axis direction; and a second extension part connected to the first extension part and overlapped with the first extension part in a direction perpendicular to the optical axis direction.

In addition, one among the plurality of first driving units is disposed on one side of the second extension part, and the other may be disposed on the other side of the second extension part.

A camera module according to an aspect of the present invention for achieving the above objective comprises: a first substrate; a second substrate disposed on the first substrate and electrically connected to the first substrate; an image sensor disposed on the second substrate; a lens holder disposed on the second substrate; a liquid lens unit disposed inside the lens holder; a first driver disposed on the second substrate; a second driving unit facing the first driving unit; and a third substrate disposed with the second driving unit, disposed on the second substrate, and electrically connected to the first substrate, wherein the second substrate may comprise: a first region disposed with the image sensor; a second region being bent from one end of the first region in a first direction; and a third area being bent from one end of the second area in a second direction.

Advantageous Effects

Through this embodiment a sensor driving device and a camera module capable of reducing the size of the sensor driving device and reducing the power consumption may be provided.

DETAILED DESCRIPTION

Hereinafter, embodiments of the present invention will be described in detail with reference to the accompanying drawings.

However, the technical idea of the present invention is not limited to some embodiments to be described, but may be implemented in various forms, and if it is within the scope of the technical idea of the present invention, one or more of the components may be selected, combined, and substituted between the embodiments for use.

In addition, terms (comprising technical and scientific terms) used in the embodiments of the present invention are generally understood by those of ordinary skill in the technical field to which the present invention belongs unless explicitly defined and described, and it can be interpreted as a meaning, and terms generally used, such as terms defined in a dictionary, may be interpreted in consideration of the meaning in the context of the related technology.

In addition, terms used in the embodiments of the present invention are for describing the embodiments and are not intended to limit the present invention.

In the present specification, the singular form may comprise the plural form unless specifically stated in the phrase, and when described as "at least one (or more than one) of A and B and C", it may contain one or more of all combinations that can be combined with A, B, and C.

In addition, terms such as first, second, A, B, (a), (b), and the like may be used in describing the components of the embodiment of the present invention. These terms are only for distinguishing the component from other components, and are not limited to the nature, order, or order of the component by the term.

And, when a component is described as being 'connected', 'coupled' or 'interconnected' to another component, the component is not only directly connected, coupled or interconnected to the other component, but may also comprise cases of being 'connected', 'coupled', or 'interconnected' due that another component between that other components.

In addition, when it is described as being formed or disposed in the "top (upper side) or bottom (lower side)" of each component, the top (upper side) or bottom (lower side) not only comprises a case when the two components are in direct contact with each other but also comprises a case where one or more other components are formed or disposed between the two components. In addition, when expressed as "top (upper side) or bottom (lower side)", the meaning of not only an upward direction but also a downward direction based on one component may be comprised.

The 'optical axis direction' used below is defined as the optical axis direction of the lens coupled to the holder. Meanwhile, the 'optical axis direction' may correspond to an 'up-down direction', a 'z-axis direction', and the like. Hereinafter, the present invention will be described in more detail with reference to the accompanying drawings.

Figure 1:
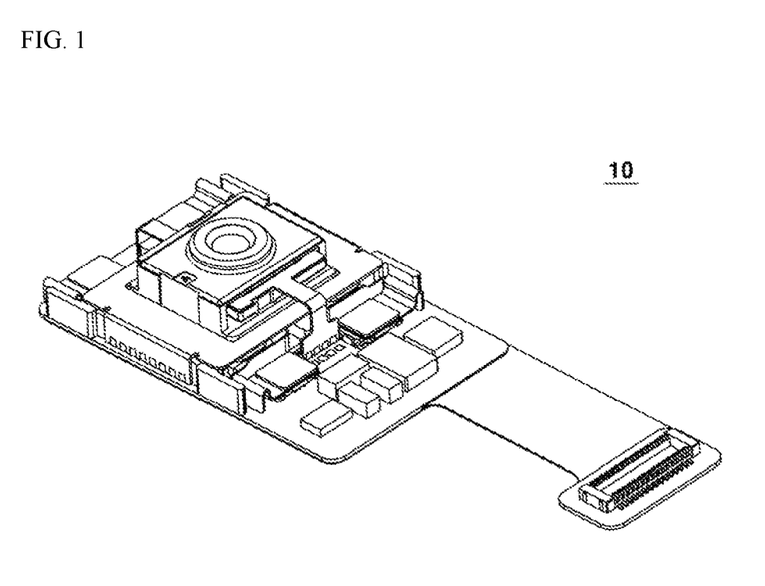
FIG. 1 is a perspective view of a camera module according to an embodiment of the present invention.
Figure 2:
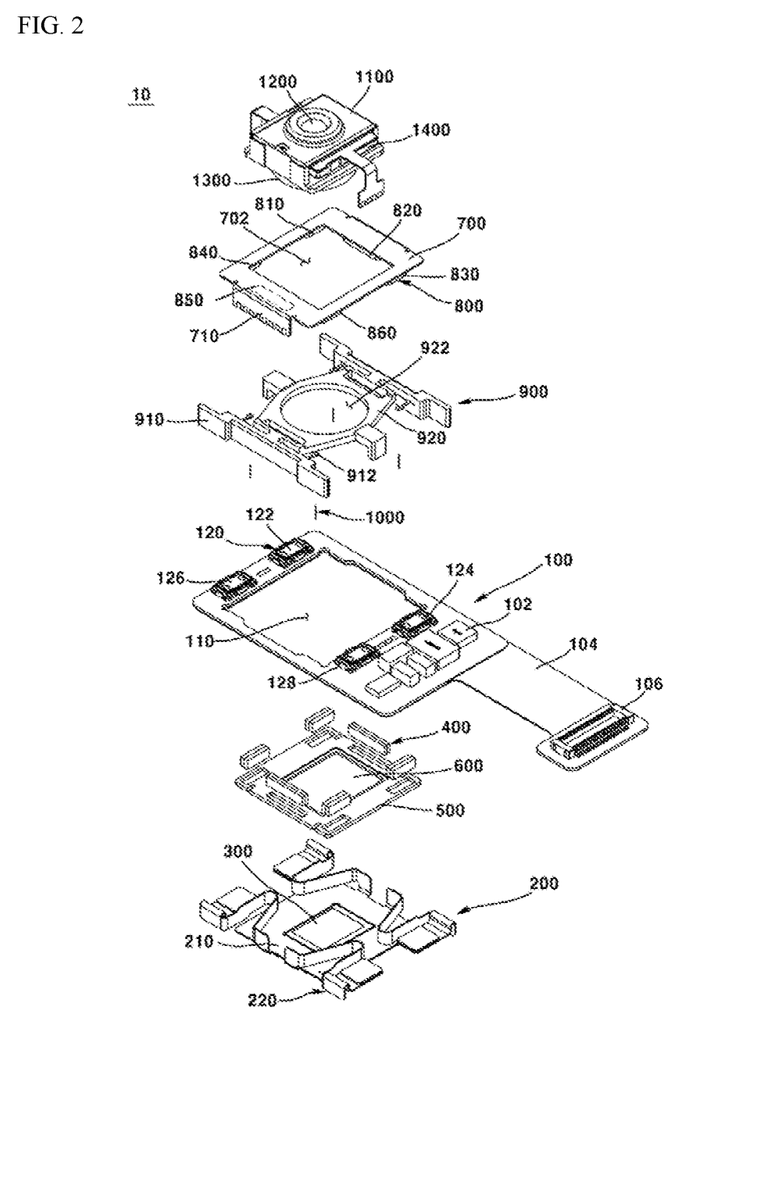
FIG. 2 is an exploded perspective view of a camera module according to an embodiment of the present invention.
Figure 3:
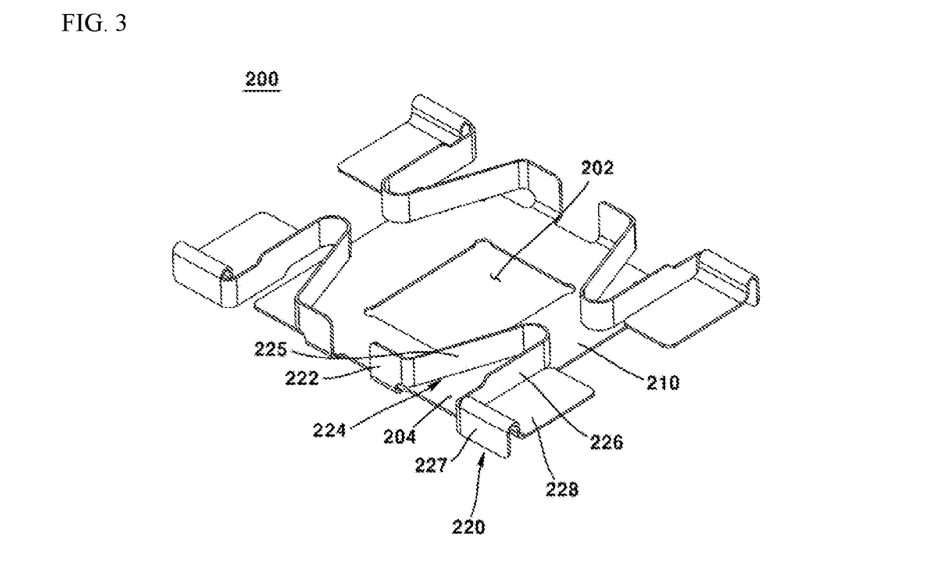
FIG. 3 is a perspective view of a partial configuration of a camera module according to an embodiment of the present invention.
Figure 4:
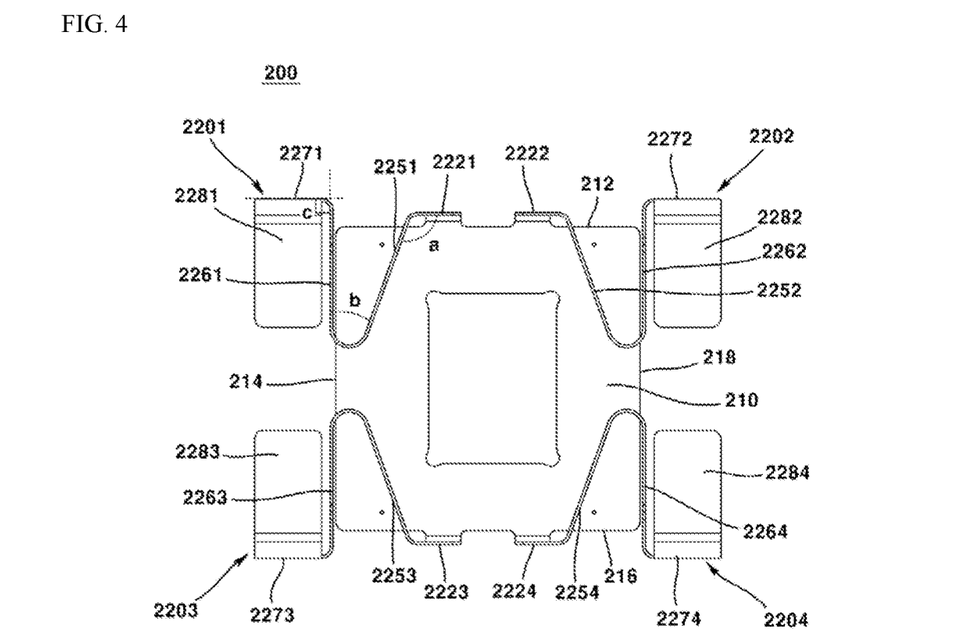
FIG. 4 is a plan view of a partial configuration of a camera module according to an embodiment of the present invention.
Figure 5:
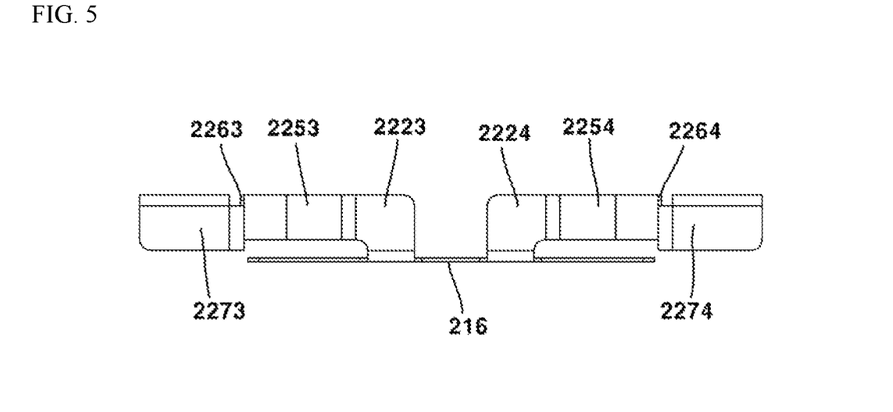
FIG. 5 is a front view of a partial configuration of a camera module according to an embodiment of the present invention.
Figure 6:
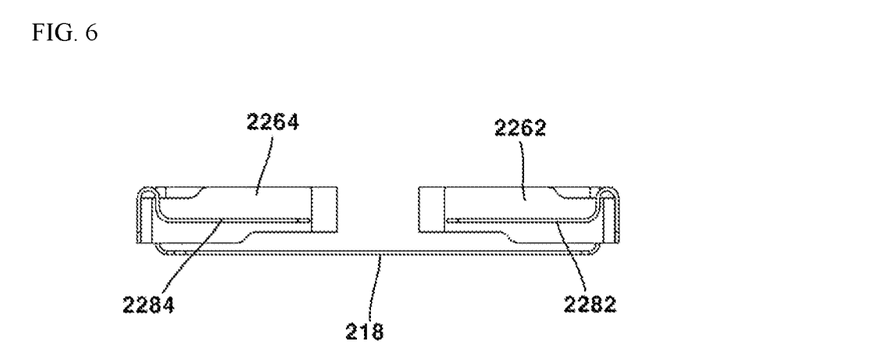
FIG. 6 is a side view of a partial configuration of a camera module according to an embodiment of the present invention.
Figure 7:
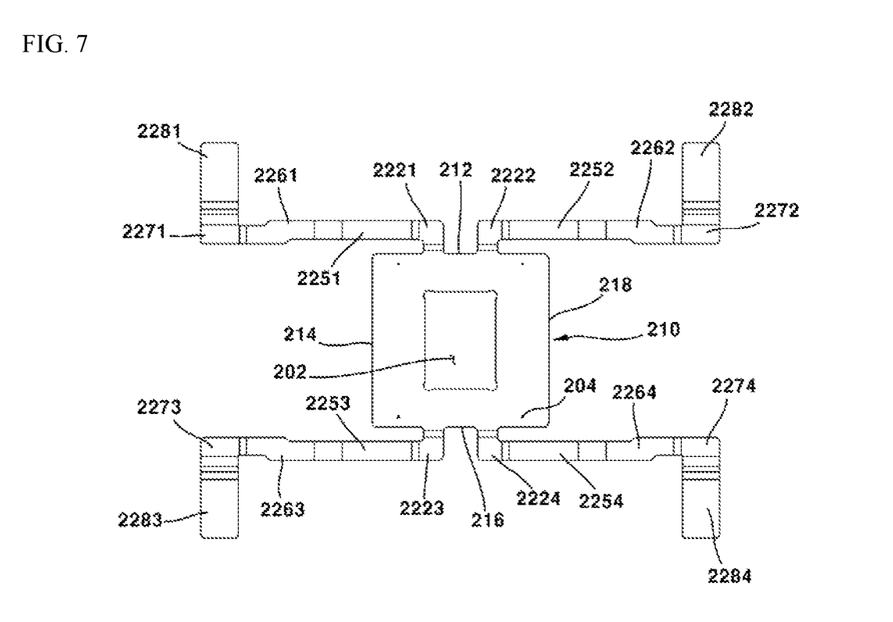
FIG. 7 is an exploded view of some configurations of a camera module according to an embodiment of the present invention.
Figure 8:
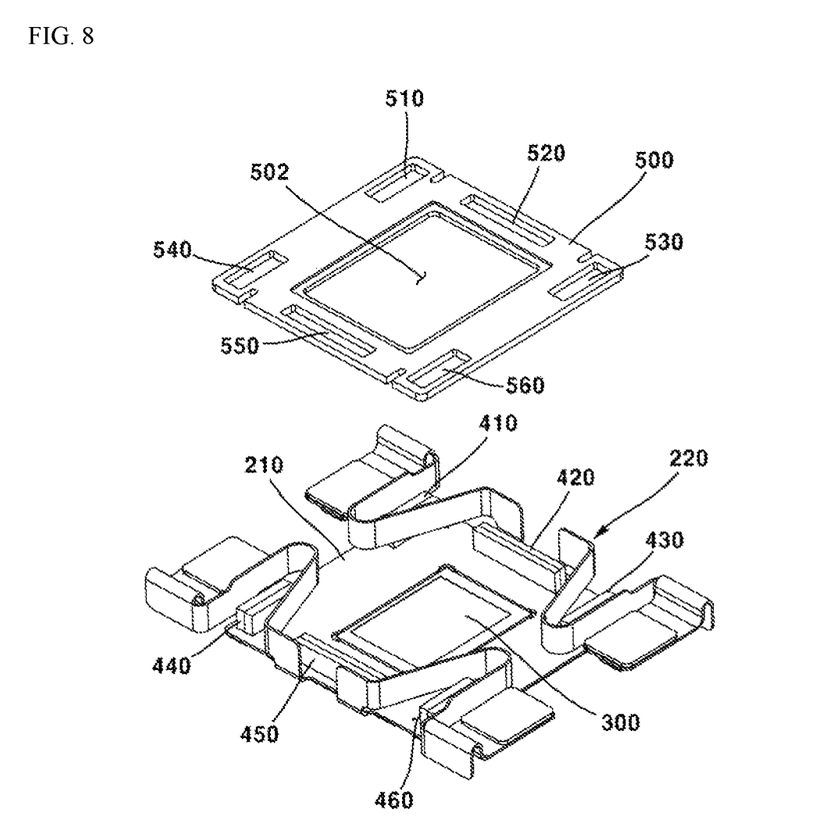
FIG. 8 is a perspective view of a partial configuration of a camera module according to an embodiment of the present invention.
Figure 9:
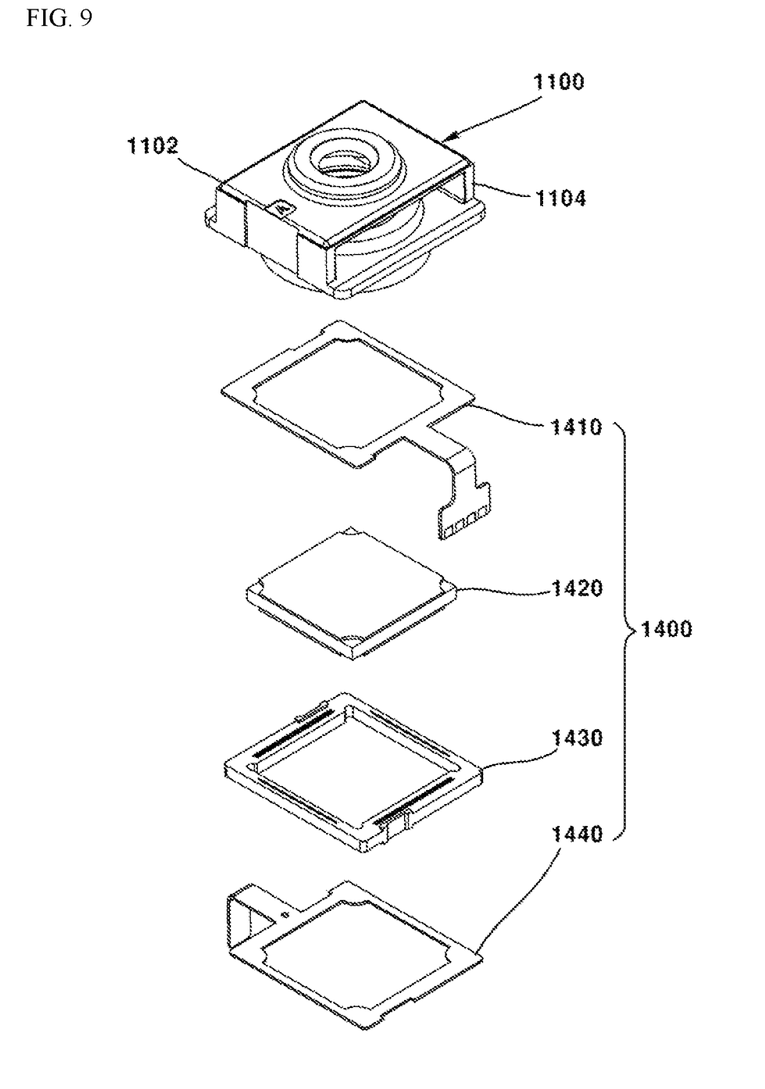
FIG. 9 is a perspective view of a partial configuration of a camera module according to an embodiment of the present invention.

FIG. 1 is a perspective view of a camera module according to an embodiment of the present invention. FIG. 2 is an exploded perspective view of a camera module according to an embodiment of the present invention. FIG. 3 is a perspective view of a partial configuration of a camera module according to an embodiment of the present invention. FIG. 4 is a plan view of a partial configuration of a camera module according to an embodiment of the present invention. FIG. 5 is a front view of a partial configuration of a camera module according to an embodiment of the present invention. FIG. 6 is a side view of a partial configuration of a camera module according to an embodiment of the present invention. FIG. 7 is an exploded view of some configurations of a camera module according to an embodiment of the present invention. FIG. 8 is a perspective view of a partial configuration of a camera module according to an embodiment of the present invention. FIG. 9 is a perspective view of a partial configuration of a camera module according to an embodiment of the present invention.

Referring to FIGS. 1 to 10, the camera module 10 according to an embodiment of the present invention may comprise: a first substrate 100, a second substrate 200, an image sensor 300, and a first driving unit 400, a filter 600, a second driving unit 800, a holder 900, a wire 1000, a lens holder 1100, and a lens module, however, it may be implemented by excluding some of these configurations, but not excluding additional configurations other than these. At this time, the lens module may comprise a first lens unit 1200, a second lens unit 1300, and a liquid lens unit 1400. In addition, the camera module 10 may comprise a sensor driving device. The sensor driving device may comprise a first substrate 100, a second substrate 200, a first driving unit 400, and a second driving unit 800, but it does not exclude additional configuration other than these. In addition, the camera module 10 may be comprised in an optical device. The optical device may comprise a housing for mounting at least one of a camera module 10, a display unit, a communication module, a memory storage unit, and a battery.

The camera module 10 may comprise a first substrate 100. A second substrate 200 may be disposed on the first substrate 100. The first substrate 100 may be electrically connected to the second substrate 200. A holder 900 may be disposed on the first substrate 100. The first substrate 100 and the second substrate 200 may be integrally formed. The first substrate 100 may comprise a first opening 110, a connector 120, a device 102, a flexible printed circuit board (FPCB) 104, and an external connector 106.

The first substrate 100 may comprise a first opening 110. A body 210 of the second substrate 200 may be disposed in the first opening 110. The first opening 110 may be formed larger than the body 210 of the second substrate 200. The first opening 110 may be formed smaller than the second substrate 200. The first opening 110 may be overlapped, in the optical axis direction, with the body 210 of the second substrate 200, the image sensor 300, the first driving unit 400, the third substrate 500 and the filter 600, the fourth substrate 700, the second driving unit 800, at least a portion of the holder 900, the wire 1000, the lens holder 1100, the first lens unit 1200, the second lens unit 1300, and the liquid lens unit 1400.

The first substrate 100 may comprise a connector 120. The connector 120 may be disposed on the upper surface of the first substrate 100. The connector 120 may be disposed at a position adjacent to the opening 110. The connector 120 may be disposed at a position adjacent to the long side of the opening 110. The connector 120 may be coupled to a pad part 220 of the second substrate 200. The connector 120 may be electrically connected to the pad part 220 of the second substrate 200. The connector 120 may comprise a plurality of connectors. The connector 120 may comprise first to fourth connectors 122, 124, 126, and 128. The first to fourth connectors 122, 124, 126, and 128 may be spaced apart from each other. The first and third connectors 122 and 126 are disposed adjacent to the first long side of the opening 110, and the second and fourth connectors 124 and 128 may be disposed adjacent to the opening 110 and the second long side facing the first long side. The first connector 122 is electrically connected to the first pad part 2201, the second connector 124 is electrically connected to the second pad part 2202, the third connector 126 is electrically connected to the third pad part 2203, and the fourth connector 128 may be electrically connected to the fourth pad part 2204.

The first substrate 100 may comprise a device 102. The device 102 may comprise at least one of a passive device and an active device, and may have various widths and heights. That is, the device 102 refers to a plurality of circuit elements, and may be protruded toward the outside while having a height higher than the height of the first substrate 100. The plurality of circuit elements 102 may not be overlapped with the lens module in the optical axis direction.

The first substrate 100 may comprise an FPCB 104. The first substrate 100 may be formed of a rigid flexible printed circuit board (RFPCB) comprising the FPCB 104. The FPCB 104 may be bent as required by the space in which the camera module 10 is mounted.

The first substrate 100 may comprise an external connector 106. The external connector 106 may electrically connect the first substrate 100 to an external power source or other device (e.g., an application processor) outside the camera module 10.

The camera module 10 may comprise a second substrate 200. The second substrate 200 may be disposed on the first substrate 100. At least a portion of the second substrate 200 may be overlapped with the first opening 110 in the optical axis direction. The second substrate 200 may be electrically connected to the first substrate 100. At least a portion of the second substrate 200 may be overlapped with the first driving unit 400 and the second driving unit 800 in the optical axis direction. At least a portion of the second substrate 200 may be moved or rotated in a direction perpendicular to the optical axis due to magnetic interaction between the first driving unit 400 and the second driving unit 800. At least a portion of the second substrate 200 may be overlapped with the first driving unit 400 in a direction perpendicular to the optical axis direction. The second substrate 200 may comprise a body 210, a protrusion part 224, and a pad part 220.

The second substrate 200 may comprise a body 210. The body 210 may have a square plate shape. The body 210 may have a rectangular shape. The body 210 may be disposed on the first opening 110 of the first substrate 100. The body 210 may be overlapped with the first opening 110 in the optical axis direction. The image sensor 300, at least a portion of the first driving unit 400, and a wire 1000 may be disposed on the body 210. A plurality of first driving units 410, 420, 430, 440, 450, and 460 may be disposed on the upper surface of the body 210.

The body 210 may comprise a second opening 202. The image sensor 300 may be disposed in the second opening 202. The second opening 202 may be overlapped with the image sensor 300 in the optical axis direction.

The body 210 may comprise a hole 204. The hole 204 of the body 210 may be penetrated by a wire 1000. The wire 1000 may be fixed to the hole 204 of the body 210 by a method such as fusion welding and the like.

The second substrate 200 may comprise a protrusion part 224. The protrusion part 224 may be formed by extending from the body 210. The protrusion part 224 may be formed by extending from the end of the body 210. The protrusion part 224 may be formed by extending from the outer side surface of the body 210. The protrusion part 224 may be formed by extending from the body 210 in an optical axis direction, an upward direction, or a first direction. The protrusion part 224 may comprise at least one bent part. The bending angle a of the at least one bent portion may be an obtuse angle. At least a portion of the protrusion part 224 may be disposed on the body 210. At least a portion of the protrusion part 224 may be disposed to be spaced apart from the upper surface of the body 210. At least a portion of the protrusion part 224 may be disposed on the body 210.

The protrusion part 224 may comprise a first extension part 222, a second extension part 225, and a pad part 220. The first extension part 222 may be formed by extending from the body 210 in the optical axis direction. The second extension part 225 may be connected to the first extension part 222. The second extension part 225 may be overlapped with the first extension part 222 in a direction perpendicular to the optical axis, that is, in a horizontal direction.

The protrusion part 224 may comprise a plurality of protrusion parts. The protrusion part 224 may comprise first to fourth protrusion parts. The first and second protrusions are formed to be protruded from the first side 212 of the body 210, and the third and fourth protrusion parts may be formed to be protruded from the second side 216 facing the first side 212 of the body 210. The first and second protrusion parts are protruded from one end of the body 210, and the third and fourth protrusion parts may be protruded from the other end of the body 21. The first to fourth protrusion parts may be protruded from the short side of the body 210. The first to fourth protrusion parts may be disposed spaced apart from each other. Each of the first to fourth protrusion parts may comprise a first extension part 222 and a second extension part 225.

The first extension part 2221 of the first protrusion part may be protruded from one end of the body 210. The first extension part 2221 of the first protrusion part may be formed by extending from the body 210 in a first direction. The second extension part 2251 of the first protrusion part may be formed by extending from the first extension part 2221 in a second direction different from the first direction. The second extension part 2251 of the first protrusion part may be overlapped with the body 210 in the optical axis direction.

The first extension part 2222 of the second protrusion part may be protruded from one end of the body 210. The first extension part 2222 of the second protrusion part may be formed by extending from the body 210 in a first direction. The second extension part 2252 of the first protrusion part may be formed by extending from the first extension part 2222 in a second direction. The second extension part 2252 of the second protrusion part may be overlapped with the body 210 in the optical axis direction.

The first extension part 2223 of the third protrusion part may be protruded from the other end of the body 210. The first extension part 2223 of the third protrusion part may be formed by extending from the body 210 in a third direction. The second extension part 2253 of the third protrusion part may be formed by extending from the first extension part 2223 in a fourth direction different from the first direction. The second extension part 2253 of the third protrusion part may be overlapped with the body 210 in the optical axis direction.

The first extension part 2224 of the fourth protrusion part may be protruded from the other end of the body 210. The first extension part 2224 of the fourth protrusion part may be formed by extending from the body 210 in a third direction. The second extension part 2254 of the fourth protrusion part may be formed by extending in the fourth direction from the first extension part 2224. The second extension part 2254 of the fourth protrusion part may be overlapped with the body 210 in the optical axis direction.

Here, the first direction and the third direction may mean an optical axis direction. In addition, the second direction and the fourth direction may mean a direction passing through a region overlapped with the body 210 and the optical axis direction. In addition, the first direction may mean an upward direction with respect to the first short side 212 of the body 210 of the second substrate 200, and the second direction may be a direction pointing toward the short side 216 facing the first short side 212. At this time, the third direction may mean an upward direction with respect to the second short side 216 of the body 210 of the second substrate 200, and the fourth direction may also mean a direction pointing toward the first short side 212 corresponding to the second short side 216. However, the first to fourth directions are not limited thereto and may be variously changed.

In this case, as illustrated in FIG. 7, it can also be applied on an exploded view. Referring to FIG. 7, a first direction of a first extension part 2221 of a first protrusion part is an upward direction with respect to the body 210 of the second substrate 200, and the second direction of the second extension part 2251 of the first protrusion part may mean a direction other than the upward direction based on the body 210 of the second substrate 200. In addition, the third direction of the first extension part 2223 of the third protrusion part is a downward direction different from the first direction, and the fourth direction may mean a direction other than the first direction and the third direction. In this case, the second and fourth directions may mean the same direction, or it may mean a different direction.

The second substrate 200 may comprise a pad part 220. The pad part 220 may have one end connected to the protrusion part 224 and the other end connected to the connector 120 of the first substrate 100. The other end of the pad part 220 may be disposed on the first substrate 110. The pad part 220 may comprise a first pad unit 226, a second pad unit 227, and a third pad unit 228. One end of the first pad unit 226 may be disposed adjacent to the short sides 212 and 216 of the body 210, and the other end may be disposed adjacent to the long sides 214 and 218 of the body 210. The second pad unit 227 may not be overlapped with the first opening 110 of the first substrate 100 in the optical axis direction. The third pad unit 227 may be disposed adjacent to the first opening 110 of the first substrate 100. The first pad unit 226 and the second pad unit 227 may be formed to have an "L" shape as a whole. The pad part 220 may comprise a plurality of pad parts. A plurality of pad units may be spaced apart from each other. The plurality of pad units may not be overlapped with the body 210 in the optical axis direction. The first pad unit 226 and the second pad unit 227 may be overlapped with the first opening 110 of the first substrate 100 in the optical axis direction. The pad part 220 may comprise first to fourth pad parts 2201, 2202, 2203, and 2204. Each of the first to fourth pad parts 2201, 2202, 2203, and 2204 may comprise a first pad unit 226, a second pad unit 227, and a third pad unit 228.

The first pad unit 2261 of the first pad part 2201 may be connected to a second extension part 2251 of the first protrusion part. The first pad unit 2261 of the first pad part 2201 may be formed by being bent from the second extension part 2251 of the first protrusion part. The first pad unit 2261 of the first pad part 2201 may form a predetermined angle b with the second extension part 2251 of the first protrusion part. Here, the predetermined angle b may be an acute angle. The second pad unit 2271 of the first pad part 2201 may be formed by being bent from the first pad unit 2261 of the first pad part. The second pad unit 2271 of the first pad part 2201 may have a predetermined angle c with the first pad unit 2261 of the first pad part 2201. Here, the predetermined angle may be a right angle. The third pad unit 2281 of the first pad part 2201 may be formed by being bent from the second pad unit 2271 of the first pad part 2201. The third pad unit 2281 of the first pad part 2201 may be disposed on the first substrate 100. The third pad unit 2281 of the first pad part 2201 may be coupled to the first connector 122.

The first pad unit 2262 of the second pad part 2202 may be connected to the second extension part 2252 of the second protrusion part. The first pad unit 2262 of the second pad part 2202 may be formed by being bent from the second extension part 2252 of the second protrusion part. The first pad unit 2262 of the second pad part 2202 may form a predetermined angle b with the second extension part 2252 of the second protrusion part. Here, the predetermined angle b may be an acute angle. The second pad unit 2272 of the second pad part 2202 may be formed by being bent from the first pad unit 2262 of the second pad part. The second pad unit 2272 of the second pad part 2202 may form a predetermined angle c with the first pad unit 2262 of the second pad part 2202. Here, the predetermined angle may be a right angle. The third pad unit 2282 of the second pad part 2202 may be formed by being bent from the second pad unit 2272 of the second pad part 2202. The third pad unit 2282 of the second pad part 2202 may be disposed on the first substrate 100. The third pad unit 2282 of the second pad part 2202 may be coupled to the second connector 124.

The first pad unit 2263 of the third pad part 2203 may be connected to the second extension part 2253 of the third protrusion part. The first pad unit 2263 of the third pad part 2203 may be formed by being bent from the second extension part 2253 of the third protrusion part. The first pad unit 2263 of the third pad part 2203 may form a predetermined angle b with the second extension part 2253 of the third protrusion part. Here, the predetermined angle b may be an acute angle. The second pad unit 2273 of the third pad part 2203 may be formed by being bent from the first pad unit 2263 of the third pad part. The second pad unit 2273 of the third pad part 2203 may form a predetermined angle c with the first pad unit 2263 of the third pad part 2203. Here, the predetermined angle may be a right angle. The third pad unit 2283 of the third pad part 2203 may be formed by being bent from the second pad unit 2273 of the third pad part 2203. The third pad unit 2283 of the third pad part 2203 may be disposed on the first substrate 100. The third pad unit 2283 of the third pad part 2203 may be coupled to the third connector 126.

The first pad unit 2264 of the fourth pad part 2204 may be connected to the second extension part 2254 of the fourth protrusion part. The first pad unit 2264 of the fourth pad part 2204 may be formed by being bent from the second extension part 2254 of the fourth protrusion part. The first pad unit 2264 of the fourth pad part 2204 may form a predetermined angle b with the second extension part 2254 of the fourth protrusion part. Here, the predetermined angle b may be an acute angle. The second pad unit 2274 of the fourth pad part 2204 may be formed by being bent from the first pad unit 2264 of the fourth pad part 2204. The second pad unit 2274 of the fourth pad part 2204 may form a predetermined angle c with the first pad unit 2264 of the fourth pad part 2204. Here, the predetermined angle may be a right angle. The third pad unit 2284 of the fourth pad part 2204 may be formed by being bent from the second pad unit 2274 of the fourth pad part 2204. The third pad unit 2284 of the fourth pad part 2204 may be disposed on the first substrate 100. The third pad unit 2284 of the fourth pad part 2204 may be coupled to the fourth connector 128.

The second substrate 200 comprises a first region 210 in which the image sensor 300 is disposed, a second region 222 being bent from one end of the first region 210 in a first direction, and a third region 225 being bent from one end of the second region 222 in a second direction. The second region 222 may be overlapped with the first driving unit 400 in a direction perpendicular to the optical axis, that is, in a horizontal direction.

The camera module 10 may comprise an image sensor 300. The image sensor 300 may be disposed on the second substrate 200. The image sensor 300 may be disposed in the second opening 202 formed in the second substrate 200. Unlike this, the image sensor 300 may be mounted on a separate support member and disposed at a position overlapped with the second opening 202 in the optical axis direction. The image sensor 300 may be formed in a rectangular shape corresponding to the second opening 202 of the second substrate 200. The image sensor 300 may perform a function of converting light that has passed through the lens module into an image data. More specifically, the image sensor 300 may convert light into an analog signal through a pixel array comprising a plurality of pixels, and generate the image data by synthesizing a digital signal corresponding to the analog signal.

The camera module 10 may comprise a first driving unit 400. The first driving unit 400 may be disposed on the second substrate 200. The first driving unit 400 may electromagnetically interact with the second driving unit 800. The second substrate 200 may be moved or rotated with respect to the first substrate 100 through an electromagnetic interaction between the first driving unit 400 and the second driving unit 800. The first driving unit 400 may comprise a plurality of first driving units 410, 420, 430, 440, 450, and 460 and a third substrate 500.

The plurality of first driving units 410, 420, 430, 440, 450, and 460 may be disposed on the upper surface of the body 210 of the second substrate 200. Each of the plurality of first driving units 410, 420, 430, 440, 450, and 460 may comprise a magnet magnetized with an N pole and an S pole. The plurality of first driving units 410, 420, 430, 440, 450, and 460 may be disposed adjacent to the circumference of the image sensor 300.

The plurality of first driving units 410, 420, 430, 440, 450, and 460 may comprise: two first driving units 410 and 440 disposed adjacent to both ends of the first side of the image sensor 300; two first driving units 430 and 460 disposed adjacent to both ends of the second side facing the first side of the image sensor 300; and two first driving units 420 and 450 disposed adjacent to a central region of a third side and a fourth side of the image sensor.

The plurality of first driving units 410, 420, 430, 440, 450, and 460 may comprise: four first driving units 410, 430, 440, 460 disposed adjacent to the edge region of the image sensor 300; and two first driving units 420 and 450 disposed adjacent to the central region of the side of the image sensor 300.

The plurality of first driving units 410, 420, 430, 440, 450, and 460 may comprise: two first driving units 410 and 440 disposed adjacent to the edge of the body 210 of the second substrate 200 and formed by extending along the third side 214; two first driving units 430 and 460 disposed adjacent to the edge of the body 210 of the second substrate 200 and formed by extending along the fourth side 218 facing the third side 214; one first driving unit 420 disposed adjacent to a central region of the first side 212 of the body 210 of the second substrate 200 and formed by extending along the first side 212; and one first driving unit 450 disposed adjacent to a central region of the second side 216 of the body 210 of the second substrate 200 and formed by extending along the second side 216.

The plurality of first driving units 410, 420, 430, 440, 450, and 460 may be overlapped with a portion of the second substrate 200 in a direction perpendicular to the optical axis. Specifically, the plurality of first driving units 410, 420, 430, 440, 450, and 460 may be overlapped with a protrusion part 224 of the second substrate 200, a pad part 220 in a direction perpendicular to the optical axis. One 410 of the plurality of first driving units 410, 420, 430, 440, 450, and 460 is disposed on one side of the second extension part 2251 of the first protrusion part, and the other 420 may be disposed on the other side of the second extension part 2251.

Among the plurality of first driving units 410, 420, 430, 440, 450, and 460: one 410 is disposed between the second extension part 2251 of the first protrusion part and the first pad unit 2261 of the first pad part 2201; the other 420 is disposed between a second extension part 2251 of a first protrusion part and a second extension part 2252 of a second protrusion part; another one 430 is disposed between the second extension part 2252 of the second protrusion part and the first pad unit 2262 of the second pad part 2202; another one 440 is disposed between the first pad unit 2263 of the third pad part 2203 and the second extension part 2253 of the third protrusion part; another one 450 is disposed between the second extension part 2253 of the third protrusion part and the second extension part 2254 of the fourth protrusion part; and another one 460 may be disposed between the second extension part 2254 of the fourth protrusion part and the first pad unit 2264 of the fourth pad part 2204.

A plurality of first driving units 410, 420, 430, 440, 450, and 460 may be disposed on the third substrate 500. The third substrate 500 may comprise a third opening 502 and a plurality of holes 510, 520, 530, 540, 550, and 560. The third opening 502 may be overlapped with the image sensor 300 in the optical axis direction. A filter 600 may be disposed in the third opening 502. A plurality of first driving units 410, 420, 430, 440, 450, and 460 may be disposed in the plurality of holes 510, 520, 530, 540, 550, and 560 of the third substrate 500. Each of the plurality of holes 510, 520, 530, 540, 550, and 560 of the third substrate 500 is at a position corresponding to each of the plurality of first driving units 410, 420, 430, 440, 450, and 460 is formed, and may be formed in a corresponding shape. The third substrate 500 may be formed of an insulating material, but is not limited thereto and may be variously changed.

In addition, the third substrate 500 may comprise a slit formed by extending from an outer side surface or a hole formed by extending in a vertical direction. The plurality of slits or holes of the third substrate 500 may be formed in a position overlapped with the hole 204 of the second substrate 200 and the arm 912 of the holder 900 in the optical axis direction. Through this, when a wire 100 is connected to the arm 912 of the holder 900 and the hole 204 of the second substrate 200, an interference phenomenon may be prevented. The slits of the third substrate 500 may comprise a plurality of slits, or the holes of the third substrate 500 may comprise a plurality of holes.

The camera module 10 may comprise a filter 600. The filter 600 may filter light corresponding to a specific wavelength range for the light that has passed through the first lens unit 1200, the liquid lens unit 1400, and the second lens unit 1300. The filter 600 may be an infrared (IR) cutoff filter or an ultraviolet (UV) cutoff filter, but the scope of the present invention is not limited thereto. The filter 600 may be disposed on the image sensor 300. The filter 600 may be disposed inside the third substrate 500. The filter 600 may be disposed in the third opening 502 of the third substrate 500. The filter 600 may be disposed or mounted in an inner groove or a step of the third substrate 500.

The camera module 10 may comprise a second driving unit 800. The second driving unit 800 may correspond to the first driving unit 400. Specifically, the second driving unit 800 may be disposed at a position facing the first driving unit 400. The second driving unit 800 may comprise a plurality of second driving units 810, 820, 830, 840, 850, and 860 and a fourth substrate 700.

The plurality of second driving units 810, 820, 830, 840, 850, and 860 may face the plurality of first driving units 410, 420, 430, 440, 450, and 460, respectively. The plurality of second driving units 810, 820, 830, 840, 850, and 860 may be overlapped with the plurality of first driving units 410, 420, 430, 440, 450, and 460 in the optical axis direction, respectively. The plurality of second driving units 810, 820, 830, 840, 850, and 860 may be formed in a shape corresponding to the plurality of first driving units 410, 420, 430, 440, 450, and 460. The plurality of second driving units 810, 820, 830, 840, 850, and 860 may comprise coils. The plurality of second driving units 810, 820, 830, 840, 850, and 860 may be disposed on the lower surface of the fourth substrate 700. The plurality of second driving units 810, 820, 830, 840, 850, and 860 may comprise a fine pattern coil.

A plurality of second driving units 810, 820, 830, 840, 850, and 860 may be disposed on the fourth substrate 700. A plurality of second driving units 810, 820, 830, 840, 850, and 860 may be disposed on the lower surface of the fourth substrate 700. The fourth substrate 700 may comprise a fourth opening 702 and a terminal portion 710. The fourth opening 702 may be overlapped with the image sensor 300 in the optical axis direction. The terminal portion 710 may be formed by extending from the side of the fourth substrate 700 in the optical axis direction or downward direction. One end of the terminal portion 710 may be formed by extending from a side surface of the fourth substrate 700, and the other end may be disposed in a groove formed in the first opening 110 of the first substrate 100. The terminal portion 710 may electrically connect the fourth substrate 700 and the first substrate 100.

The camera module 10 may comprise a holder 900. The holder 900 may be disposed between the first driving unit 400 and the second driving unit 800. The holder 900 may be fixedly disposed on the first substrate 100. The holder 900 may be overlapped with the first substrate 100 in the optical axis direction. The holder 900 may not be overlapped with a plurality of first driving units 410, 420, 430, 440, 450, and 460, a plurality of second driving units 810, 820, 830, 840, 850, and 860, and the protrusion part 224 of the second substrate 200, and the pad part 220 in the optical axis direction. Through this, the holder 900 fixedly disposed on the first substrate 100 can reduce the effect on the electromagnetic interaction occurring between a plurality of first driving units 410, 420, 430, 440, 450, and 460 and a plurality of second driving units 810, 820, 830, 840, 850, and 860. The holder 900 may comprise a support part 910, a central part 920, and an arm 912.

The support part 910 may be fixed to the upper surface of the first substrate 100 using an adhesive or the like. The support part 910 may be formed by extending outwardly from the central part 920 and formed by extending downward. In one embodiment of the present invention, the support part 910 is disposed on the upper surface of the first substrate 100 in six regions as an example, but this is not limited thereto, and the shape of the support part 910 may be variously changed.

In addition, the support part 910 may be formed in a shape that does not be overlapped with a plurality of first driving units 410, 420, 430, 440, 450, and 460, a plurality of second driving units 810, 820, 830, 840, 850, and 860, the protrusion part 224 of the second substrate 200, and the pad part 220 in the optical axis direction. Specifically, the support part 910 may comprise first and second support units disposed on the upper surface of the second substrate 200 adjacent to the first short side 212 and the second short side 216 of the second substrate 200; and two second support units disposed on the upper surface of the second substrate 200 adjacent to a first long side 214 and a second long side 218. At this time, the second support unit may be formed in a letter "¬" shape. In addition, the first and second support units may comprise holes formed concave in the center direction of the support part 910 so that the terminal portion 710 of the fourth substrate 700 is disposed.

The central part 920 may be formed in a hexagonal plate shape. The central part 920 may be disposed above the first opening 110 of the first substrate 100. The central part 920 may comprise a fifth opening 922. The fifth opening 922 may be disposed in a central region of the central part 920. The fifth opening 922 may be overlapped with the image sensor 300, the filter 600, the lens module and the optical axis direction. The fifth opening 922 may be disposed between the fourth opening 702 and the third opening 502. The fifth opening 922 may have a circular shape.

In addition, the central part 920 may be formed in a shape not overlapped with a plurality of first driving units 410, 420, 430, 440, 450, and 460, a plurality of second driving units 810, 820, 830, 840, 850, and 860, the protrusion part 224 of the substrate 200, and the pad part 220 in the optical axis direction. Specifically, the central part 920 may comprise a hole disposed between the outer surface and the fifth opening 922. The hole of the central part 920 may be formed in a shape corresponding to at least a part of a plurality of first driving units 410, 420, 430, 440, 450, and 460 and a plurality of second driving units 810, 820, 830, 840, 850, and 860 and disposed at a corresponding position. In one embodiment of the present invention, the hole of the central part 920 is described as an example that it is formed in a shape corresponding to the two first drive units 420 and 450 and the two second driving units 820 and 850, in a position not overlapped with two first driving units 420 and 450 among a plurality of first driving units 410, 420, 430, 440, 450, and 460, and two second driving units 820 and 850 of the second driving units 810, 820, 830, 840, 850, and 860 in the optical axis direction, but is not limited thereto and may be variously changed.

The arm 912 may be formed by extending from the support part 910 in a direction perpendicular to the optical axis. The arm 912 may be formed by extending from the support part 910 to an inner region of the holder 900. The arm 912 may be formed of a metal material. The wire 1000 may be coupled to the hole formed in the arm 912. The arm 912 may comprise a plurality of arms formed spaced apart from each other. In an embodiment of the present invention, four arms are described as an example, but the present invention is not limited thereto and may be variously changed according to the number of wires 1000.

The camera module 10 may comprise a wire 1000. The wire 1000 may be coupled to the second substrate 200 and the holder 900. One end of the wire 1000 may be coupled to the hole 204 of the second substrate 200, and the other end may be coupled to the hole of the arm 912 of the holder 900. The wire 1000 may be formed by extending in the optical axis direction. The wire 1000 may elastically support the movement or rotation of the second substrate 200. The wire 1000 may comprise a plurality of wires. In one embodiment of the present invention, the number of wires is described to be four as an example, but the number of wires 1000 is not limited thereto, and the number of wires 1000 may be variously changed.

The camera module 10 may comprise a lens holder 1100. The lens holder 1100 may comprise a first side surface 1102 having a first opening and a second side surface 1104 having a second opening facing the first opening in a direction perpendicular to the optical axis direction. The lens holder 1100 may comprise a through hole in which an upper portion and a lower portion thereof is open, and the first lens unit 1200, the liquid lens unit 1400, and the second lens unit 1300 may be disposed in the through hole formed in the inside of the lens holder 1100. The first lens unit 1200 and the second lens unit 1300 may be solid lens units. The first lens unit 1200 may be coupled to an upper hole formed above the lens holder 1100, and the second lens unit 1300 may be coupled to a lower hole formed below the lens holder 1100. The liquid lens unit 1400 may be disposed and coupled to a first opening and/or a second opening positioned between the upper hole and the lower hole, or disposed and coupled between the first opening and the second opening. Light incident on the first lens 1200 from the outside of the camera module 10 may pass through the liquid lens unit 1400 and enter the second lens unit 1300.

The camera module 10 may comprise a first lens unit 1200 and a second lens unit 1300. The first lens unit 1200 may be disposed in an upper hole of the lens holder 1100. The second lens unit 1300 may be disposed in a lower hole of the lens holder 1100. The first lens unit 1200 and the second lens unit 1300 may comprise at least one lens.

An exposure lens (not shown) may be provided on the front side of the first lens unit 1100, and a cover glass may be disposed on the front side of the exposure lens. Since the exposure lens is protruded toward the outside of the lens holder 900, it is exposed to the outside and the surface may be damaged. If the surface of the lens is damaged, the image quality of the image captured by the camera module 10 may be deteriorated. Therefore, in order to prevent and suppress surface damage of the exposed lens, a method such as disposing a cover glass, forming a coating layer, or a method of configuring an exposed lens with a wear-resistant material having a higher rigidity than that of the first lens unit 1200 or the second lens unit 1300 may be applied to prevent surface damage of the exposed lens.

The camera module 10 may comprise a liquid lens unit 1400. The liquid lens unit 1400 may be disposed on the lens holder 1100. The liquid lens unit 1400 may be inserted or disposed in the first opening or the second opening formed in the side walls 1102 and 1104 of the lens holder 1100. The liquid lens unit 1400 may comprise an individual electrode connection substrate 1410, a liquid lens 1420, a spacer 1430, and a common electrode connection substrate 1440.

The individual electrode connection substrate 1410 may electrically connect the individual electrodes of the liquid lens unit 1400 to the first substrate 100. The individual electrode connection substrate 1410 may be implemented as an FPCB. The liquid lens 1420 may comprise a plurality of plates formed to accommodate two different liquids.

The spacer 1430 may be coupled while surrounding the liquid lens 1420, and may protect the liquid lens 1420 from external impact. Also, the spacer 1430 may be in contact with a gripper during insertion into the lens holder 1100 or during active alignment.

The common electrode connection substrate 1440 may electrically connect the common electrode of the liquid lens unit 1400 to the first substrate 100. The common electrode connection substrate 1440 may be implemented as a flexible circuit board (FPCB) or a single metal substrate (conductive metal plate), and may be implemented as a metal substrate comprising an insulating layer in at least a partial region excluding the pad exposed at a position corresponding to the pad for the common electrode of the pads and the first substrate 100.

Each of the common electrode connection substrate 1440 and the individual electrode connection substrate 1410 may be bent toward the first substrate 100. The individual electrode connection substrate 1410 may be electrically connected to electrode pads formed on the first substrate 100 through connection pads electrically connected to each of the individual electrodes. The connection pad and the electrode pad may be electrically connected by a conductive epoxy or soldering, but the scope of the present invention is not limited thereto.

Likewise, the common electrode connection substrate 1440 may be electrically connected to an electrode pad formed on the first substrate 100 through a connection pad electrically connected to the common electrode.

Here, the electrode pads connected to the common electrode connection substrate 1440 and the individual electrode connection substrate 1410 may be defined as a first pad member and a second pad member, respectively, and the first pad member and the second pad member may be disposed in a direction away from the element 102 disposed on the first substrate 100 in the center of the liquid lens.

The interface between the conductive liquid and the non-conductive liquid is deformed by the driving voltage applied through the common electrode connection substrate 1440 and the individual electrode connection substrate 1410, so that the curvature and/or focal length of the liquid lens unit 1400 can be changed. When the deformation of the interface and the change of curvature are controlled, the liquid lens unit 1400 and the camera module 10 and the optical device comprising the same can perform an autofocusing (AF) function, camera shake correction or image shake prevention (optical image stabilizer, OIS) functions, and the like.

FIGS. 10 to 13 are operational diagrams of a camera module according to an embodiment of the present invention.

Hereinafter, an operation of the camera module according to an embodiment of the present invention will be described with reference to FIGS. 10 to 13.

Figure 10:
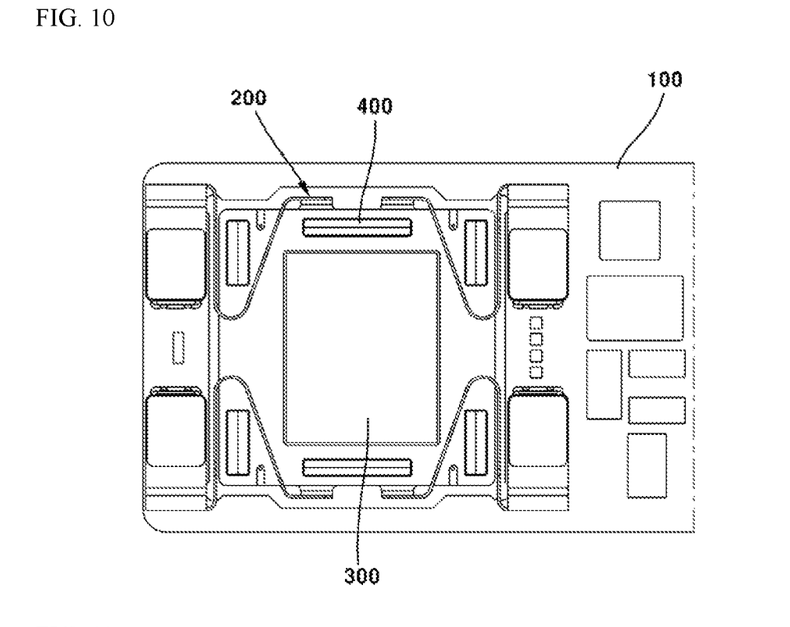
FIGS. 10 to 13 are operational diagrams of a camera module according to an embodiment of the present invention.
Figure 11:
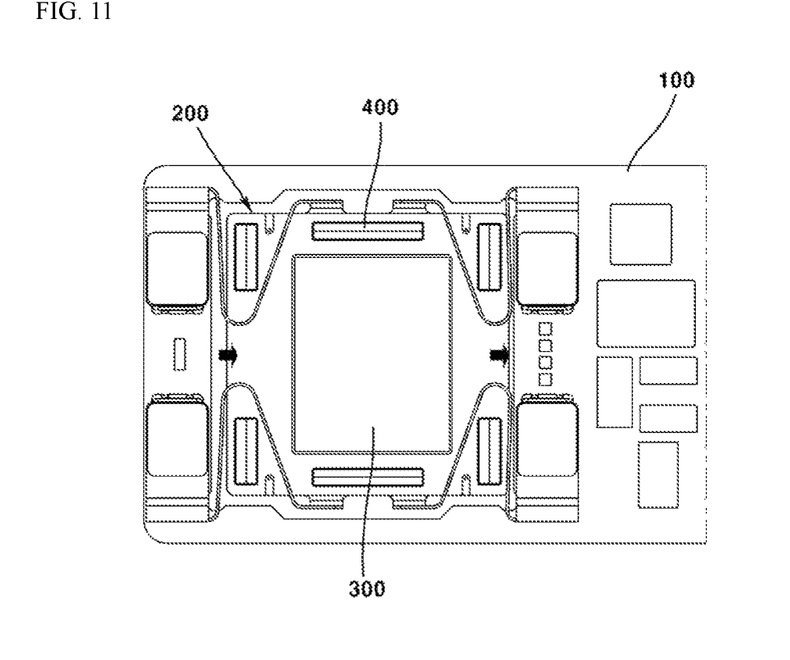

Referring to FIGS. 10 and 11, the second substrate 200 is moved in the x-axis direction through electromagnetic interaction between the first driving unit 400 and the second driving unit 800. At this time, the protrusion part 224 and the pad part 220 of the second substrate 200 that are being bent at least twice are moved in the x-axis.

Figure 12:
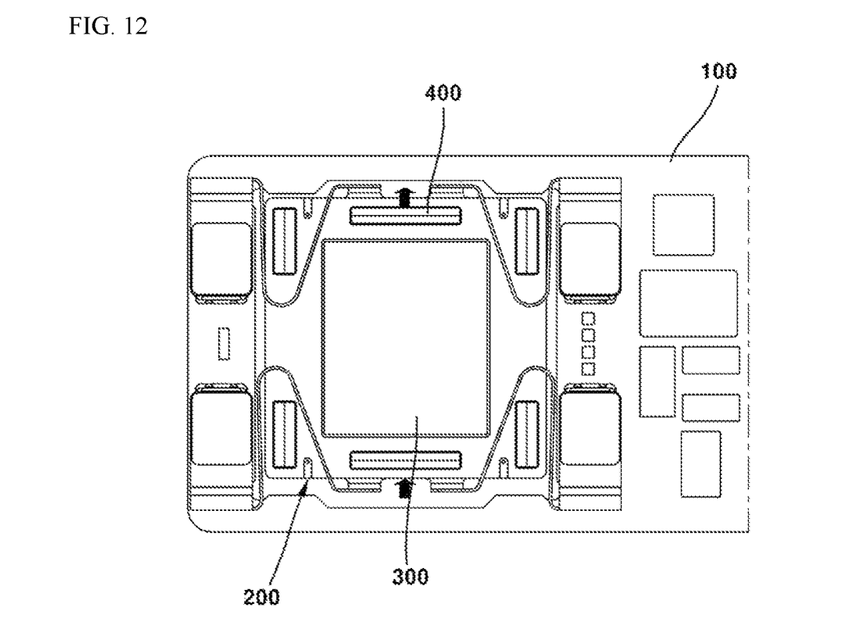

Referring to FIGS. 10 and 12, the second substrate 200 is moved in the y-axis direction through electromagnetic interaction between the first driving unit 400 and the second driving unit 800. At this time, the protrusion part 224 and the pad part 220 of the second substrate 200 that are being bent at least twice are moved along the y-axis.

Figure 13:
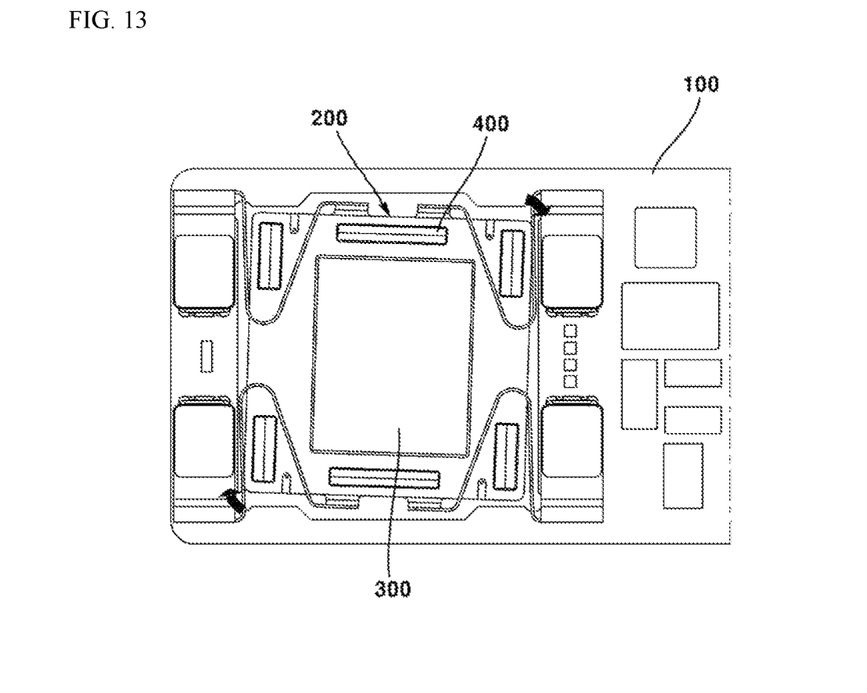

Referring to FIGS. 10 and 13, the second substrate 200 is rotated in one direction through electromagnetic interaction between the first driving unit 400 and the second driving unit 800. At this time, the protrusion part 224 and the pad part 220 of the second substrate 200 that are being bent at least twice are rotated in one direction.

In the camera module 10 according to the embodiment of the present invention, the spring stiffness is reduced due to the protrusion part 224 and the pad part 220 of the second substrate 200 that is being bent at least twice, thereby reducing tension. Accordingly, it is possible to reduce the size of the sensor driving device and reduce power consumption. In addition, it is possible to reduce power consumption of a sensor driving device due to the rigid symmetric structure. Therefore, it is possible to reduce the size of the camera module 10 and reduce the power consumption.

The embodiments of the present invention have been described above with reference to the accompanying drawings, but a person skilled in the art to which the present invention belongs may understand that the present invention can be implemented in other specific forms without changing the technical spirit or essential features. Therefore, it should be understood that the embodiments described above are illustrative and non-limiting in all respects.

The invention claimed is:

1. A sensor driving device comprising:
   a first substrate;
   a second substrate disposed on the first substrate and electrically connected with the first substrate;
   an image sensor configured to move together with at least a portion of the second substrate; and
   a driving unit configured to move the image sensor in a direction perpendicular to an optical axis of the image sensor,
   wherein the second substrate comprising a body and a first protrusion part protruding from a first lateral surface of the body, wherein the first protrusion part comprises a first extension part bent from the body to have a first bending axis, and a second extension part bent from the first extension part to have a second bending axis, wherein the second bending axis is parallel with the optical axis, and wherein the first bending axis is perpendicular to the second bending axis.

2. The sensor driving device of claim 1, wherein the first extension part of the first protrusion part of the second substrate is parallel with the optical axis.

3. The sensor driving device of claim 1, wherein the second extension part of the first protrusion part of the second substrate is parallel with the optical axis.

4. The sensor driving device of claim 1, wherein the second substrate comprises a second protrusion part protruding from a second lateral surface of the body opposite to the first lateral surface of the body, wherein the second protrusion part comprises a first extension part bent from the body to have a third bending axis, and a second extension part bent from the first extension part of the second protrusion part to have a fourth bending axis, wherein the fourth bending axis is parallel with the optical axis, and wherein the third bending axis is perpendicular to the fourth bending axis.

5. The sensor driving device of claim 4, wherein the first extension part of the second protrusion part of the second substrate is parallel with the optical axis.

6. The sensor driving device of claim 4, wherein the second extension part of the second protrusion part of the second substrate is parallel with the optical axis.

7. The sensor driving device of claim 4, wherein the first extension part of the first protrusion part and the first extension part of the second protrusion part face each other.

8. The sensor driving device of claim 4, wherein the second extension part of the first protrusion part is closer to the second extension part of the second protrusion part than to the first extension part of the second protrusion part.

9. The sensor driving device of claim 4, wherein, in a direction perpendicular to the first extension part of the first protrusion part, the first extension part of the first protrusion part is overlapped with the first extension part of the second protrusion part.

10. The sensor driving device of claim 1, wherein, in a direction perpendicular to the first extension part of the first protrusion part, the second extension part of the first protrusion part is overlapped with the second extension part of the second protrusion part.

11. The sensor driving device of claim 1, wherein the image sensor is electrically connected with the second substrate.

12. The sensor driving device of claim 1, wherein the driving unit comprises a first driving unit disposed on the second substrate, and a second driving unit corresponding to the first driving unit.

13. The sensor driving device of claim 1, wherein the driving unit comprises a coil disposed on the first substrate, and a magnet disposed on the second substrate, and wherein the magnet is configured to move together with the image sensor with respect to the first substrate, when a current is supplied to the coil.

14. A camera module comprising:

the sensor driving device of claim 1; and a lens disposed at a position corresponding with the image sensor.

15. The camera module of claim 14, comprising a liquid lens disposed on the lens.

16. The camera module of claim 14, comprising a focus adjustment unit configured to move the lens in an optical axis direction.

17. An optical apparatus comprising:

a housing;

the camera module of claim 14 disposed on the housing; and a display disposed on the housing.

18. The sensor driving device of claim 1, comprising:

a holder fixedly disposed on the first substrate; and a wire, wherein the holder comprises an arm formed of a metal material, wherein one end portion of the wire is coupled with the second substrate, and wherein another end portion of the wire is coupled with the arm.

19. A sensor driving device comprising:

a first substrate;

a second substrate disposed on the first substrate and electrically connected with the first substrate;

an image sensor configured to move together with at least a portion of the second substrate; and a driving unit configured to move the image sensor in a direction perpendicular to an optical axis of the image sensor, wherein the second substrate comprising a body and a first protrusion part protruding from a first lateral surface of the body, wherein the first protrusion part comprises a first extension part bent from the body to have a first bending axis, and a second extension part bent from the first extension part to have a second bending axis, wherein the first bending axis is perpendicular to the second bending axis, and wherein the first extension part of the first protrusion part of the second substrate is parallel with the optical axis.

20. The sensor driving device of claim 19, wherein the second extension part of the first protrusion part of the second substrate is parallel with the optical axis.

* * * * *